United States Patent
Hung et al.

(10) Patent No.: US 10,396,975 B2
(45) Date of Patent: Aug. 27, 2019

(54) CLOCK RECOVERY SYSTEM AND METHOD FOR NEAR FIELD COMMUNICATION WITH ACTIVE LOAD MODULATION

(71) Applicant: Maxim Integrated Products, Inc., San Jose, CA (US)

(72) Inventors: Jonathan C.H. Hung, Plano, TX (US); Thomas Michael Maguire, Plano, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 82 days.

(21) Appl. No.: 15/631,517

(22) Filed: Jun. 23, 2017

(65) Prior Publication Data

US 2018/0006801 A1    Jan. 4, 2018

Related U.S. Application Data

(60) Provisional application No. 62/356,062, filed on Jun. 29, 2016.

(51) Int. Cl.
   *H04L 7/033* (2006.01)
   *G06K 7/10* (2006.01)
   (Continued)

(52) U.S. Cl.
   CPC ........ *H04L 7/0337* (2013.01); *G06K 7/10237* (2013.01); *G06K 19/0723* (2013.01);
   (Continued)

(58) Field of Classification Search
   CPC ...... G06K 7/10; G06K 7/10237; G06K 19/07;
   G06K 19/0723; H03D 3/24; H03K 7/08;
   H03K 9/04; H03L 7/06; H03L 7/07;
   H03L 7/20; H03L 7/081; H03L 7/083;
   H03L 7/085; H03L 7/0812; H04B 5/00;
   H04B 5/0031; H04B 5/0056; H04B
   15/00; H04H 60/29; H04L 7/00; H04L
   7/02;
   (Continued)

(56) References Cited

U.S. PATENT DOCUMENTS 8,934,836 B2    1/2015  Lefley
62,235,980     10/2015  Hung
   (Continued)

OTHER PUBLICATIONS

M. Gebhart; M. Wobak; E. Merlin; C. Chlestil, "Active Load Modulation for Contactless Near-Field Communication", Published in: RFID-Technologies and Applications (RFID-TA), 2012 IEEE International Conference on Nov. 5-7, 2012, 6 pages.

*Primary Examiner* — Shawkat M Ali

(57) ABSTRACT

A system includes a tank circuit, a synchronization circuit, a transmitter, and a control circuit. The tank circuit is configured to receive a first signal transmitted from a near field communication reader. The synchronization circuit is configured to synchronize a clock to the first signal. The transmitter is configured to transmit data using the clock from the tank circuit to the near field communication reader using active load modulation. The control circuit is configured to disable the synchronization circuit during a modulation period of the active load modulation and to reduce energy remaining in the tank circuit at an end of the modulation period.

22 Claims, 6 Drawing Sheets

(51) Int. Cl.
*G06K 19/07* (2006.01)
*H03L 7/081* (2006.01)
*H03L 7/085* (2006.01)
*H04N 21/258* (2011.01)
*H04W 88/06* (2009.01)
*H03L 7/099* (2006.01)
*H03L 7/22* (2006.01)

(52) U.S. Cl.
CPC ............ *H03L 7/085* (2013.01); *H03L 7/0812* (2013.01); *H03L 7/099* (2013.01); *H03L 7/22* (2013.01); *H04N 21/25808* (2013.01); *H04W 88/06* (2013.01)

(58) Field of Classification Search
CPC ....... H04L 7/0012; H04L 7/033; H04L 7/085; H04L 7/0331; H04L 7/0337; H04L 27/02; H04L 27/04; H04N 21/258; H04N 21/25808; H04W 4/00; H04W 52/52; H04W 88/06
USPC ............ 327/148, 154, 156, 159; 331/25, 34; 333/128; 375/219, 238, 259, 268, 294, 375/295, 316, 375, 376; 455/41.1, 106
See application file for complete search history.

(56) References Cited

U.S. PATENT DOCUMENTS

| | | | |
|---|---|---|---|
| 9,331,748 B2 | 5/2016 | Bernard et al. | |
| 15,280,875 | 9/2016 | Hung | |
| 15,352,972 | 11/2016 | Hung | |
| 9,577,718 B2* | 2/2017 | Gaethke | H04B 5/0093 |
| 9,673,964 B2* | 6/2017 | Ghahramani | H04L 7/0012 |
| 2014/0003548 A1* | 1/2014 | Lefley | H04B 5/0075 |
| | | | 375/268 |
| 2014/0218080 A1* | 8/2014 | Choke | H03L 7/083 |
| | | | 327/148 |
| 2014/0273830 A1* | 9/2014 | Wong | H04B 5/0031 |
| | | | 455/41.1 |
| 2014/0341327 A1* | 11/2014 | Raggam | H04L 7/0331 |
| | | | 375/376 |
| 2016/0241380 A1 | 8/2016 | Ghahramani et al. | |
| 2016/0241384 A1* | 8/2016 | Frantzeskakis | H04B 5/0031 |
| 2017/0070245 A1 | 3/2017 | Mendel et al. | |

* cited by examiner

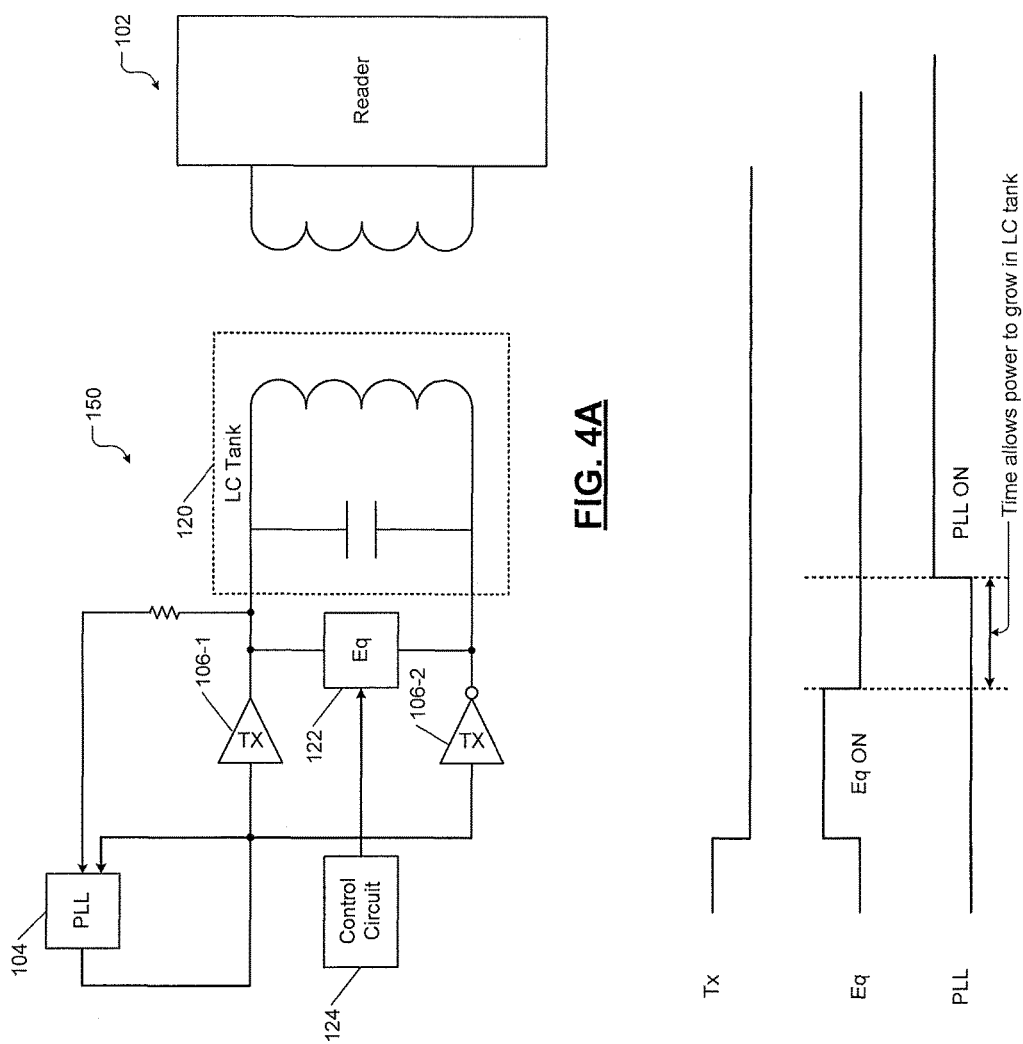

CLOCK RECOVERY SYSTEM AND METHOD FOR NEAR FIELD COMMUNICATION WITH ACTIVE LOAD MODULATION

CROSS-REFERENCE TO RELATED APPLICATIONS

The present disclosure claims the benefit of U.S. Provisional Application No. 62/356,062, filed on Jun. 29, 2016. The entire disclosure of the application referenced above is incorporated herein by reference.

The present disclosure is related to U.S. patent application Ser. No. 15/280,875, filed on Sep. 29, 2016. The entire disclosure of the application referenced above is incorporated herein by reference.

FIELD

The present disclosure relates generally to near field communication and more particularly to clock recovery system and method for near field communication with active load modulation.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Near field communication (NFC) includes a set of short-range wireless technologies. NFC operates within the globally available unlicensed ISM band of 13.56 MHz at data rates ranging from 106 to 424 Kilobits per second. NFC involves an initiator and a target. The initiator actively generates a radio frequency field that can power a passive target. NFC uses magnetic induction between two loop antennas located within each other's near field, effectively forming an air-core transformer. Typical NFC targets include unpowered tags, stickers, key fobs, or cards. NFC peer-to-peer communication is possible when both devices are powered.

NFC tags contain data and are typically read-only, but may be writeable. The NFC tags can securely store personal data such as debit and credit card information, loyalty program data, PINs and networking contacts, and/or other information. NFC-enabled portable devices can be provided with applications to read electronic tags or make payments when connected to an NFC-compliant apparatus.

SUMMARY

A system comprises a tank circuit, a synchronization circuit, a transmitter, and a control circuit. The tank circuit is configured to receive a first signal transmitted from a near field communication reader. The synchronization circuit is configured to synchronize a clock to the first signal. The transmitter is configured to transmit data using the clock from the tank circuit to the near field communication reader using active load modulation. The control circuit is configured to disable the synchronization circuit during a modulation period of the active load modulation and to reduce energy remaining in the tank circuit at an end of the modulation period.

In other features, the control circuit reduces the energy remaining in the tank circuit between the end of the modulation period and a beginning of a subsequent un-modulation period of the active load modulation.

In other features, the control circuit reduces the energy remaining in the tank circuit before enabling the synchronization circuit during a subsequent un-modulation period of the active load modulation.

In other features, the control circuit reduces the energy remaining in the tank circuit by short-circuiting the tank circuit at the end of the modulation period.

In other features, the control circuit reduces the energy remaining in the tank circuit by supplying a second signal with a predetermined phase to the tank circuit for a period of time at the end of the modulation period.

In other features, the predetermined phase is different than a phase of the energy remaining in the tank circuit at the end of the modulation period.

In other features, the predetermined phase is shifted by 180 degrees relative to a phase of the energy remaining in the tank circuit at the end of the modulation period.

In other features, the control circuit supplies the second signal to the tank circuit at a peak of a sinusoidal waveform representing the energy remaining in the tank circuit.

In other features, a point of application of the second signal to the tank circuit excludes a zero-crossing point of a sinusoidal waveform representing the energy remaining in the tank circuit.

In other features, the control circuit reduces the energy remaining in the tank circuit by shortening the modulation period.

In other features, the control circuit reduces the energy remaining in the tank circuit by extending an un-modulation period of the active load modulation.

In still other features, a method comprises receiving, at a tank circuit, a first signal transmitted from a near field communication reader, and synchronizing a clock to the first signal. The method further comprises transmitting data using the clock from the tank circuit to the near field communication reader using active load modulation. The method further comprises disabling the synchronizing during a modulation period of the active load modulation. The method further comprises reducing energy remaining in the tank circuit at an end of the modulation period.

In other features, the method further comprises reducing the energy remaining in the tank circuit between the end of the modulation period and a beginning of a subsequent un-modulation period of the active load modulation.

In other features, the method further comprises reducing the energy remaining in the tank circuit before enabling the synchronizing during a subsequent un-modulation period of the active load modulation.

In other features, the method further comprises reducing the energy remaining in the tank circuit by short-circuiting the tank circuit at the end of the modulation period.

In other features, the method further comprises reducing the energy remaining in the tank circuit by supplying a second signal with a predetermined phase to the tank circuit for a period of time at the end of the modulation period.

In other features, the predetermined phase is different than a phase of the energy remaining in the tank circuit at the end of the modulation period.

In other features, the predetermined phase is shifted by 180 degrees relative to a phase of the energy remaining in the tank circuit at the end of the modulation period.

In other features, the method further comprises supplying the second signal to the tank circuit at a peak of a sinusoidal waveform representing the energy remaining in the tank circuit.

In other features, a point of application of the second signal to the tank circuit excludes a zero-crossing point of a sinusoidal waveform representing the energy remaining in the tank circuit.

In other features, the method further comprises reducing the energy remaining in the tank circuit by shortening the modulation period.

In other features, the method further comprises reducing the energy remaining in the tank circuit by extending an un-modulation period of the active load modulation.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 4A is a functional block diagram of a NFC tag including an equalizer to dissipate energy in the LC tank of the NFC tag;

FIG. 4B is a timing diagram showing operation of the equalizer of the NFC tag of FIG. 4A;

In the drawings, reference numbers may be reused to identify similar and/or identical elements.

DETAILED DESCRIPTION

Figure 1:
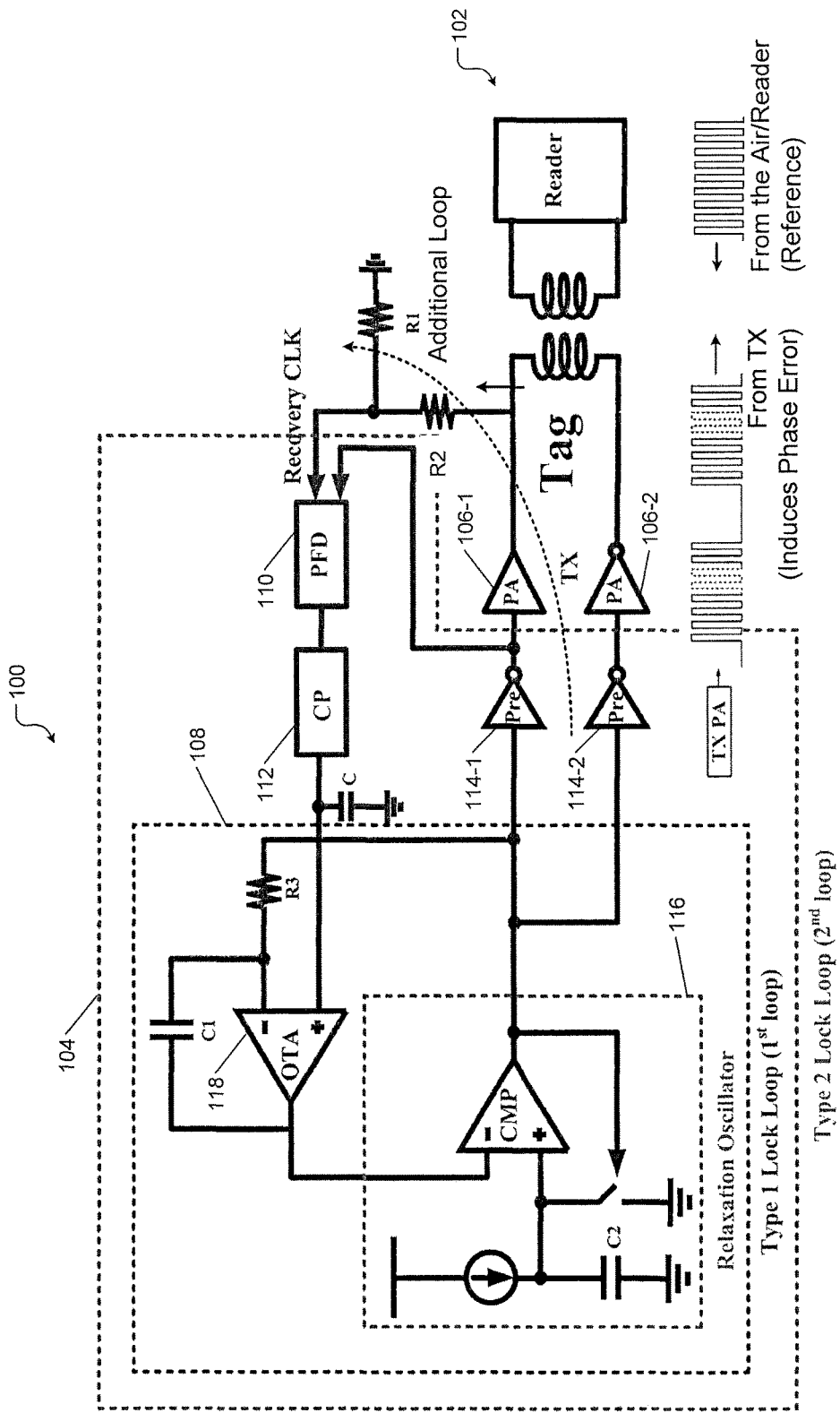
FIG. 1 is a schematic of a near field communication (NFC) tag and an NFC reader.

The present disclosure addresses a clock recovery problem in NFC Card Emulation Mode, especially for Active Load Modulation. In passive card emulation mode or tag design, devices use clock recovery from the air (reader) to build system clock. Usually the devices detect oscillations in an LC tank formed by an antenna coil (Tag). In passive applications, no additional signal is injected into the LC tank for communication, except an impedance change from the tag. For longer communication distances, Active Load Modulation (ALM) is used to transmit data from the tag to the reader. ALM mimics the load modulation behavior with increased signal strength. However, the injection of power during ALM transmission disturbs the phase in the LC tank during transmission. Even after stopping the transmission, the remaining power in the LC tank can destroy the process of clock recovery, leading to stability issues. The present disclosure provides solutions to this problem.

Specifically, the present disclosure relates to dissipating or reducing the residual energy remaining in the LC tank at the end of a modulation period and before the beginning of a subsequent un-modulation period. For example, in an approach called an equalized approach, the LC tank can be momentarily short circuited at the end of the modulation period so that when the subsequent un-modulation period begins, no energy remains in the LC tank and no phase error is introduced into the clock recovery process. In another example, in an approach called a neutralizer approach, a signal with a different phase than the phase of the energy remaining in the LC tank is injected at a specific time at the end of the modulation period. This signal reduces the amplitude of the energy remaining in the LC tank without introducing a phase error into the clock recovery process.

The present disclosure is organized as follows. Initially the problem and the solutions provided by the present disclosure are briefly described. Thereafter, the problem and the solutions provided by the present disclosure are described in detail with reference to figures.

For NFC operation between a tag and a reader, in the tag, a Voltage Controlled Oscillator (VCO) or an oscillator (a Phase-locked Loop (PLL) with self-reference) is used without recovery from the air (reader) for both transmission (TX) and system clock during data transaction. A PLL with recovery from the air (reader) is only used during receiving for frequency locking with a carrier transmitted by the reader. Since there is no clock recovery during data transmission, the system will not have stability issues due to a feedback path generated from ALM transmission to the recovery PLL's reference node. However, without any clock recovery during data transaction, the phase drift of the oscillator will create a problem for ALM transmission.

With VCO/oscillator only solution, however, the clock can continuously drift from the original locked state during data transaction. Once the frequency offset exceeds the specification, the transaction can fail.

Further, in NFC Card Emulation, Active Load Modulation (ALM) is used to mimic the load modulation behavior by transmitting a modulated signal that interferes with the carrier signal transmitted from the reader. The modulated signal needs to be transmitted with the same frequency as the carrier signal and with a specific phase offset relative to the carrier signal. Different phase of the ALM transmission can impact the strength of the load modulation. Additionally, the polarity of the signal/data can sometimes be opposite. Specific phase relationship between the ALM transmission and the carrier signal received from the reader is needed to maximize the signal strength of the transmission.

By applying closed loop frequency and phase locking (PLL) during data transaction in ALM Card Emulation mode, the frequency and phase relative to the reader can be maintained for the entire data transaction. This solves not only the frequency offset problem (due to frequency difference between tag and reader), but also the communication distance can be maximized by applying the modulated signal with proper phase offset between the ALM transmission and the carrier (air/reader).

One of the main problems involved in Active Load Modulation (ALM) with clock recovery using PLL is stability. In addition to a closed loop formed by the VCO, a Phase Frequency Detector (PFD), a Low Pass Filter (LPF), a Charge Pump (CP), and a divider (See FIG. 1 and corresponding description below), the ALM Power Amplifier (PA) can form another loop (shown by dotted curved arrow as additional loop in FIG. 1) when transmitting the modulated signal at the carrier frequency (driven by VCO), which will also be received by the PLL. This additional loop introduces extra phase error which can cause the PLL stability problem (the PLL cannot maintain lock).

The PLL or PFD can be turned off during ALM data transmission to avoid the problem of the additional loop. However, the power remaining the LC tank (antenna coil of the tag) from the ALM transmission cannot disappear within a short modulation period due to high quality factor (e.g., Q>8) of the LC tank, particularly when the data rate is high. Therefore, the residual power from the ALM transmission can be still received by the PLL (i.e., the additional loop still exists although the PLL or PFD is turned off).

For a period of time at the end of ALM modulation (TX), an equalizer or neutralizer can be applied to reduce the remaining ALM power in the LC tank. This allows the amplitude in the LC tank from the carrier (air/reader) to grow faster without wasting power to nullify the phase error from the ALM power amplifier. In this manner, the additional loop can be truly broken, and the stability problem can be prevented. The equalizer can be implemented by applying an equalizer device (e.g., a short circuit) between differential power amplifier outputs. Alternatively, a neutralizer can be implemented by applying power with opposite/different phase to the LC tank to neutralize the residual energy remaining in the LC tank and correct the phase difference to prevent the phase error.

The equalizer/neutralizer is used to reduce the remaining ALM power in the LC tank by injecting the power with different phase or polarity. The timing and period of the equalization or neutralization are predetermined to reduce the amplitude of the existing power/sine-wave in the LC tank without introducing additional phase error. Without amplitude modulation, current injection at a peak of the sine wave can reduce the amplitude without introducing a phase change. On the other hand, current injection at zero crossing of the sine wave can contribute the most phase change while providing no amplitude reduction. Considering the amplitude modulation, the timing and period of equalization/neutralization could be different. But the timing and period is selected based on minimization of the phase error and the remaining ALM amplitude.

Instead of using equalizer or neutralizer, the un-modulation period of the ALM can be extended by shortening the modulation period of the ALM so that the remaining ALM power in the LC tank has more time to decay naturally. However, this can reduce the signal to noise ratio (SNR) since the power transmission (modulation) period is shortened.

FIG. 1 shows a tag 100 and a reader 102. The tag 100 includes a PLL 104 and a differential power amplifier 106-1, 106-2 (collectively power amplifier 106) driving an antenna. The PLL 104 includes a voltage-controlled oscillator (VCO) 108, a phase frequency detector (PFD) 110, and a charge pump (CP) 112. While not shown, the PLL 104 may additionally include a loop filter (LF) (e.g., a low pass filter) connected between the CP 112 and the VCO 108. Drivers 114-1, 114-2 drive the power amplifier 106 as shown. The VCO 108 may include an oscillator (e.g., a relaxation oscillator) 116 and an operational transconductance amplifier (OTA) 118. The VCO 108 generates a clock used to transmit data via the tag antenna using Active Load Modulation (ALM). The PLL 104 synchronizes the clock to a recovery clock derived from a carrier signal received from the reader 102.

A detailed description of FIG. 1 and associated circuits and timing diagrams is found in U.S. Provisional Application No. 62/235,973, filed on Oct. 1, 2015. The entire disclosure of the application referenced above is incorporated herein by reference.

Figure 2:
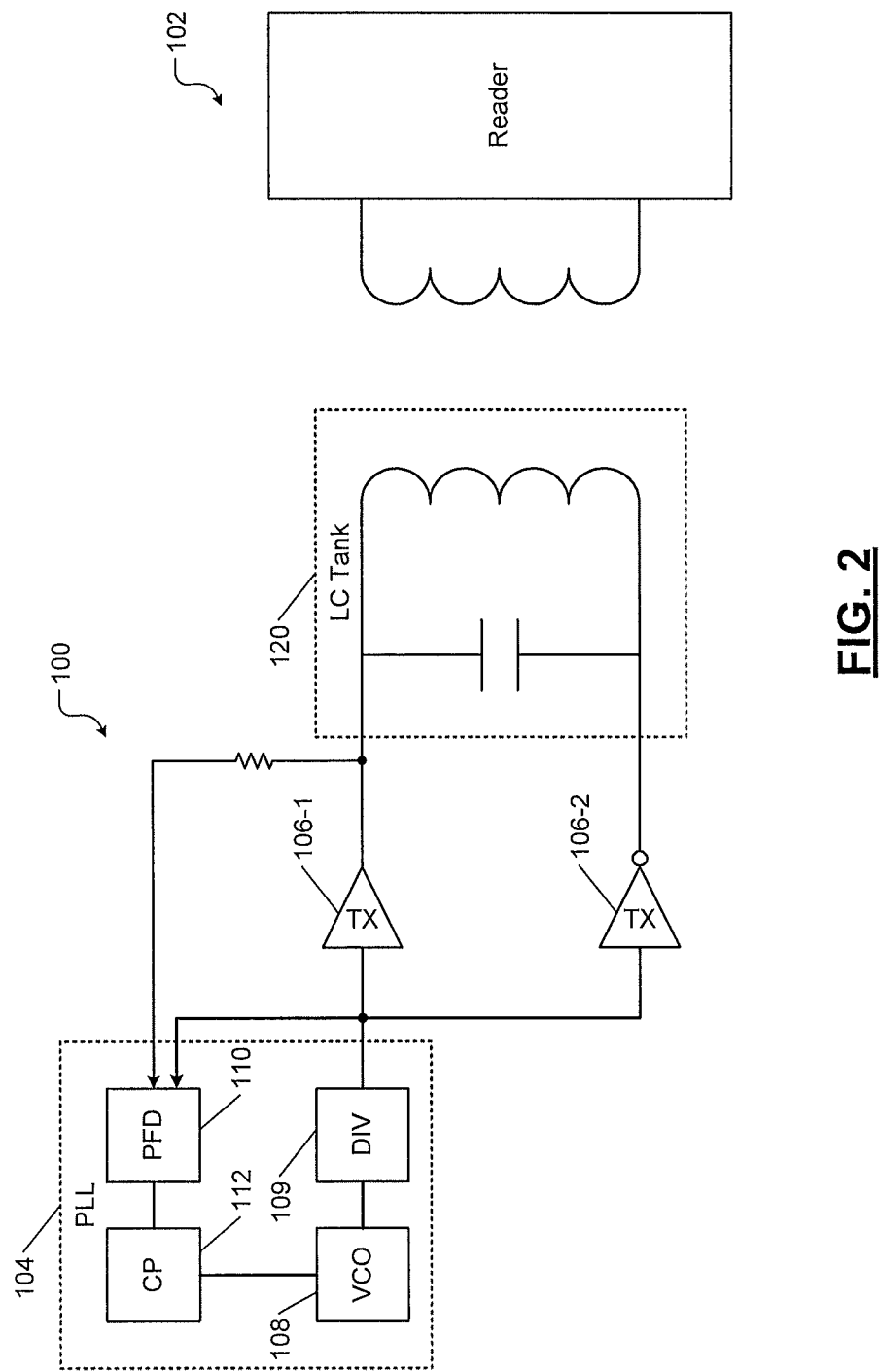
FIG. 2 is a functional block diagram of the NFC tag and the NFC reader of FIG. 1.

FIG. 2 shows a simplified block diagram of the tag 100. A divider 109 shown can be used to divide the frequency of the clock generated by the VCO 108. Also shown is an LC tank circuit (LC tank) 120 formed by the antenna coil of the tag 100. When the tag 100 is proximate to the reader 102, the tag 100 receives the carrier signal from the reader 102. The VCO 108 generates the system clock for the tag 100. The PLL 104 receives the recovery clock derived from the carrier received from the reader 102. The PLL 104 locks the phase and frequency of the system clock to the phase and frequency of the recovery clock (and therefore to the phase and frequency of the carrier) to synchronize the tag 100 to the reader 102.

The tag 100 transmits data to the reader 102 using Active Load Modulation (ALM). ALM transmission includes a modulation period (e.g., transmit a binary 1) followed by an un-modulation period (e.g., transmit a binary 0). The PLL 104 is turned off during the modulation period to prevent any phase error from being introduced due to the ALM transmission during the modulation period. However, the power output by the power amplifier 106 to the antenna coil of the tag 100 during the modulation period does not dissipate at the end of the modulation period due to a high Q factor of the LC tank 120, particularly when the data rate at which the tag 100 transmits data is high. Therefore, the residual power remaining in the LC tank 120 of the tag 100 is received by the PLL 104 when the PLL 104 is turned on again during the un-modulation period following the modulation period. The residual power from the LC tank 120 of the tag 100 can add a phase error to the PLL 104.

Figure 3:
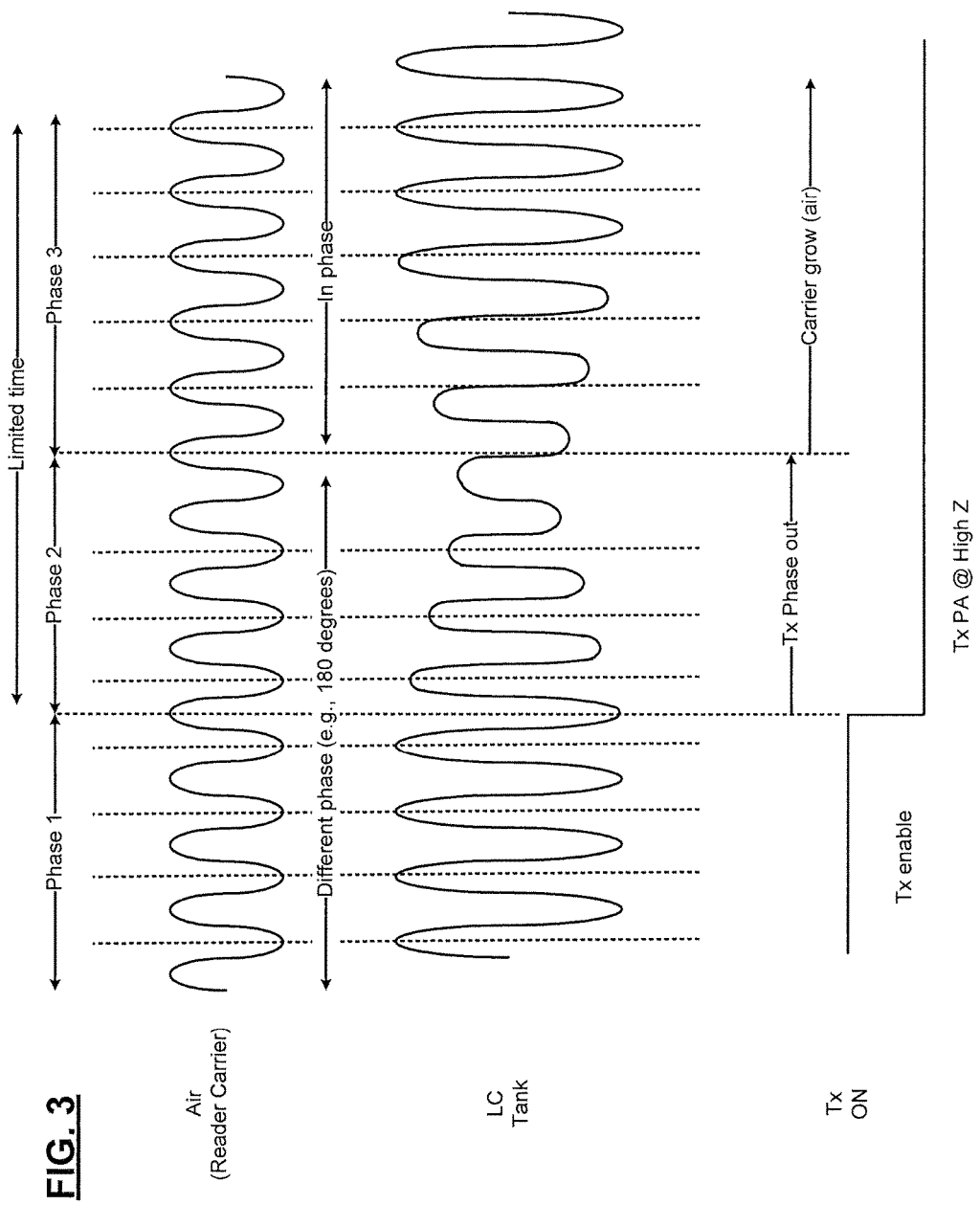
FIG. 3 is a timing diagram of a carrier of the NFC reader, energy in an LC tank of the NFC tag, and a transmit enable signal of the NFC tag of FIG. 1.

FIG. 3 shows a timing diagram of the carrier signal transmitted by the reader 102, a sinusoidal waveform representing the energy in the LC tank 120 of the tag 100, and a transmit enable signal used to enable transmission (e.g., activate the PA 106) from the tag 100 to the reader 102. The timing diagram shows a modulation period followed by an un-modulation period of the ALM transmission from the tag 100 to the reader 102.

In phase 1, the power amplifier 106 is enabled (turned on) to transmit data using ALM. Accordingly, phase 1 represents the modulation period of the ALM transmission from the tag 100 to the reader 102. The PLL 104 is turned off in phase 1.

In phases 2 and 3, the power amplifier 106 is disabled (turned off). Accordingly, phases 2 and 3 represent the un-modulation period of the ALM transmission from the tag 100 to the reader 102. In phases 2 and 3, the PLL 104 is turned on.

In phase 2, the residual energy in the LC tank 120 remains and is not substantially dissipated (e.g., not dissipated to less than or equal to a predetermined threshold) at the end of the modulation period (phase 1). Accordingly, a phase error is introduced into the PLL 104 when the PLL 104 is turned on at the beginning of the un-modulation period (at the beginning of phase 1). Phase 2 ends when the residual energy in the LC tank 120 dissipates substantially (e.g., to less than or equal to a predetermined threshold).

Phase 3 begins when the energy in the LC tank 120 begins to increase in phase with the carrier received from the reader 102. The PLL 104 can now correct any phase error in the VCO 108 and maintain phase lock based on the recovery clock derived from the carrier received from the reader 102. The PLL 104 cannot lock phase, however, if phase 3 has a short duration due to high data rate at which the tag 100 transmits data to the reader 102. Accordingly, phases 2 and 3 present a limited time within which the PLL 104 has to correct phase error.

FIGS. 4A and 4B show an example of an equalizer implementation that shortens phase 2. In FIG. 4A, a tag 150 includes all components of the tag 100 and additionally includes an equalizer 122 and a control circuit 124. The equalizer 122 is connected across the LC tank 120. For example, the equalizer 122 may be implemented by a switch such as a transistor (e.g., a MOSFET). The equalizer 122 is used to short circuit the LC tank 120 at the end of the modulation period to completely dissipate any residual energy remaining in the LC tank 120 at the end of the modulation period. The control circuit 124 turns on the switch at the end of the modulation period (i.e., when the power amplifier 106 is turned off, e.g., at the end of phase 1).

Subsequently, the equalizer 122 is turned off, the un-modulation period (phase 2) begins, and the PLL 104 is turned on. Since no residual energy remains in the LC tank 120 when the PLL 104 is turned on, no phase error is introduced into the PLL 104 when the PLL 104 is turned on. The energy in the LC tank 120 begins to increase in phase with the carrier received from the reader 102. The PLL 104 locks and maintains a phase lock based on the recovery clock derived from the carrier received from the reader 102. Effectively, phase 2 is shortened so that phase 3 is longer in which a larger recovery clock signal is supplied to the PLL 104. Phases 2 and 3 now provide sufficient time in which the PLL 104 can correct any phase error.

Figure 5A:
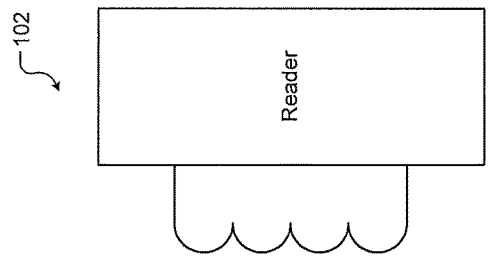
FIG. 5A is a functional block diagram of a NFC tag including a neutralizer to neutralize energy in the LC tank of the NFC tag.
Figure 5B:
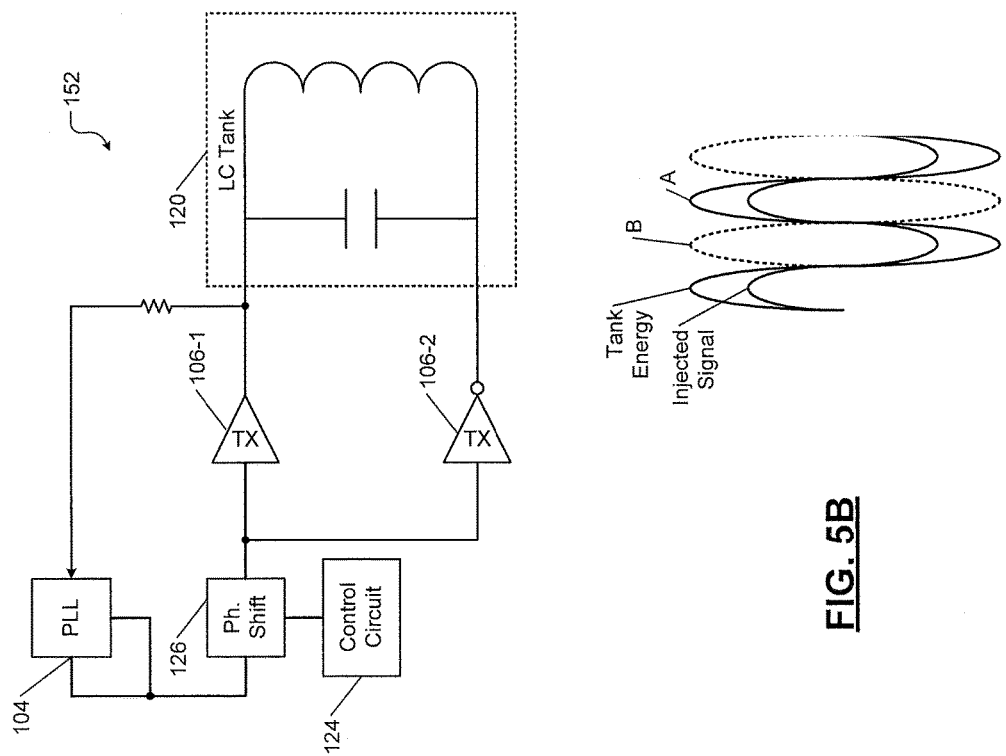
FIG. 5B is a timing diagram showing operation of the NFC tag of FIG. 5A.

FIGS. 5A and 5B show an example of a neutralizer implementation. In FIG. 5A, a tag 152 includes all components of the tag 100 and additionally includes the control circuit 124 and a phase shifter 126. The control circuit 124 turns on the phase shifter 126 at a predetermined time at the end of the modulation period (i.e., when the power amplifier 106 is turned off, e.g., at the end of phase 1). For example, the phase shifter 126 is turned on at a peak A of a sine waveform representing the energy stored in the LC tank 120. Accordingly, at point A, the phase shifter 126 injects into the LC tank 120 a signal having a different/opposite phase than the phase of the signal representing the energy stored in the LC tank 120 to reduce amplitude (i.e., dissipate energy) of the signal representing the energy stored in the LC tank 120. The injection at point A does not introduce any phase error into the PLL 104. The control circuit 124 turns on the phase shifter 126 for a predetermined period of time that is sufficient to reduce amplitude (i.e., dissipate energy) of the signal representing the energy stored in the LC tank 120 before the following un-modulation period begins (i.e., before the PLL 104 is turned on).

The phase shifter 126 is not turned on at a zero-crossing point B of the sine waveform representing the energy stored in the LC tank 120 since injecting a signal into the LC tank 120 at point B can introduce an additional phase error into the PLL 104, which will need additional time to correct in phase 3 and is therefore undesirable.

Alternatively, the phase shifter 126 can inject into the LC tank 120 a signal having a different/opposite phase than that of the signal representing the energy stored in the LC tank 120 to reduce amplitude (i.e., dissipate energy) of the signal representing the energy stored in the LC tank 120 at other suitable points between the peak A and the zero-crossing point B.

Figures 6, 7:
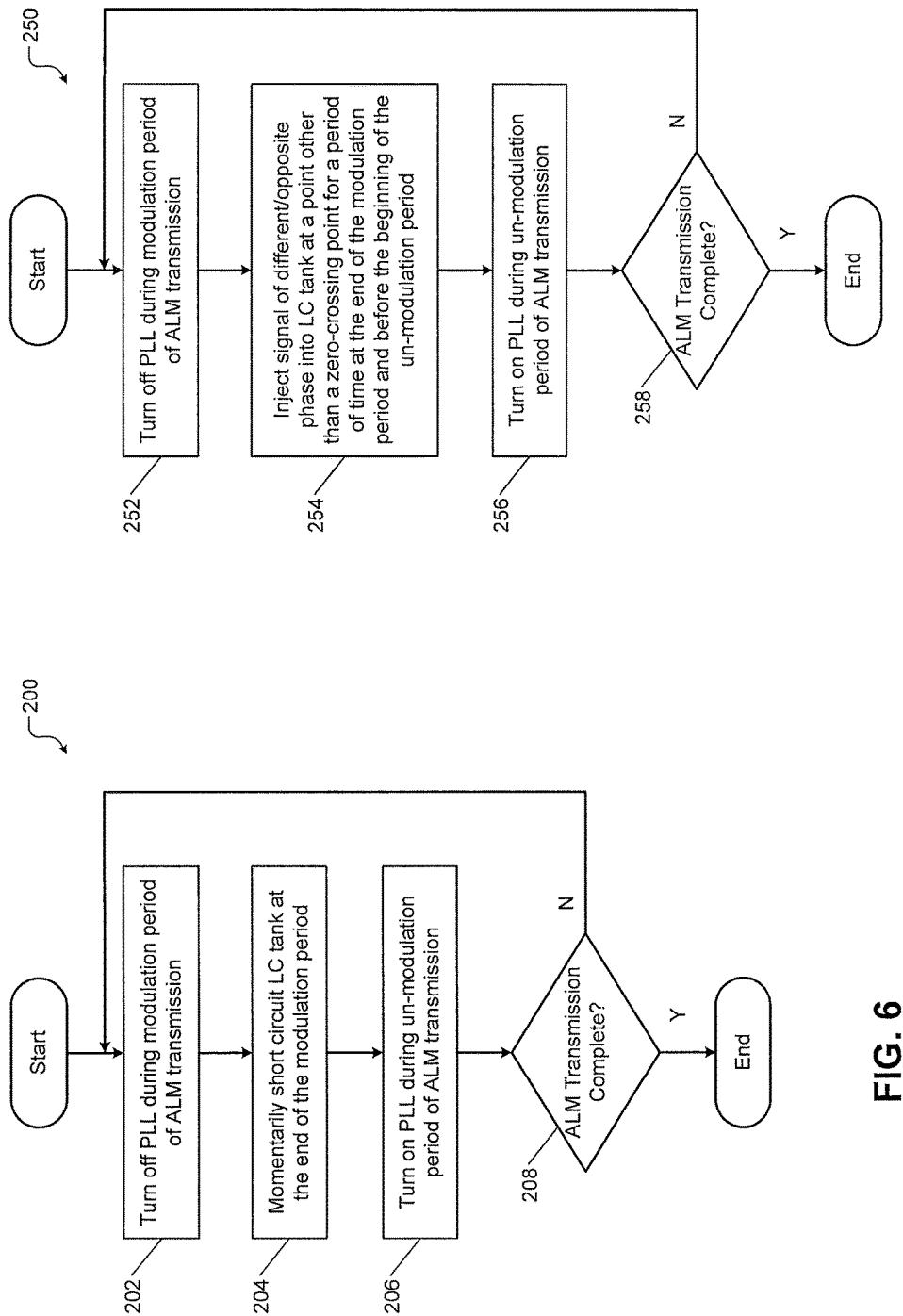
FIG. 6 is a flowchart of a method for dissipating energy in an LC tank of a tag using an equalizer at the end of a modulation period of an ALM transmission.
FIG. 7 is a flowchart of a method for reducing residual energy remaining in an LC tank of a tag using a neutralizer at the end of a modulation period of an ALM transmission.

FIG. 6 shows a method 200 for reducing residual energy remaining in an LC tank of a tag using an equalizer at the end of a modulation period of an ALM transmission. At 202, control turns off a PLL, which is used to synchronize a clock of the tag to a carrier received from a reader, during a modulation period of an ALM transmission. At 204, control momentarily short-circuits the LC tank at the end of the modulation period. At 206, control turns on the PLL at the beginning of a subsequent un-modulation period of the ALM transmission. At 208, control determines whether the ALM transmission is complete. Control returns to 202 if the ALM transmission is not complete. Control ends if the ALM transmission is complete.

FIG. 7 shows a method 250 for reducing residual energy remaining in an LC tank of a tag using a neutralizer at the end of a modulation period of an ALM transmission. At 252, control turns off a PLL, which is used to synchronize a clock of the tag to a carrier received from a reader, during a modulation period of an ALM transmission.

At 254, control injects a signal into the LC tank. The signal has a different/opposite phase than the phase of the energy stored in the LC tank. Control injects the signal into the LC tank at a point other than a zero crossing point of a signal representing the energy stored in the LC tank. For example, control injects the signal into the LC tank at a peak of the signal representing the energy stored in the LC tank. Control injects the signal into the LC tank for a predetermined time period at the end of the modulation period of the ALM transmission and before the beginning of a subsequent un-modulation period of the ALM transmission. The predetermined time period for which the signal is injected into the LC tank is sufficient to dissipate the energy stored in the LC tank (e.g., to less than or equal to a predetermined threshold) such that no phase error is introduced into the PLL when the PLL is subsequently turned on at a beginning of a subsequent un-modulation period of the ALM transmission.

At 256, control turns on the PLL at the beginning of the subsequent un-modulation period of the ALM transmission. At 258, control determines whether the ALM transmission is complete. Control returns to 252 if the ALM transmission is not complete. Control ends if the ALM transmission is complete.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A system comprising:
   a tank circuit to receive a first signal transmitted from a near field communication reader;
   a synchronization circuit to synchronize a clock to the first signal;
   a transmitter to transmit data utilizing the clock from the tank circuit to the near field communication reader utilizing active load modulation; and
   a control circuit to disable the synchronization circuit during a modulation period of the active load modulation and to reduce energy remaining in the tank circuit at an end of the modulation period.

2. The system of claim 1, wherein the control circuit reduces the energy remaining in the tank circuit between the end of the modulation period and a beginning of a subsequent un-modulation period of the active load modulation.

3. The system of claim 1, wherein the control circuit reduces the energy remaining in the tank circuit before enabling the synchronization circuit during a subsequent un-modulation period of the active load modulation.

4. The system of claim 1, wherein the control circuit reduces the energy remaining in the tank circuit by short-circuiting the tank circuit at the end of the modulation period.

5. The system of claim 1, wherein the control circuit reduces the energy remaining in the tank circuit by supplying a second signal with a predetermined phase to the tank circuit for a period of time at the end of the modulation period.

6. The system of claim 5, wherein the predetermined phase is different than a phase of the energy remaining in the tank circuit at the end of the modulation period.

7. The system of claim 5, wherein the predetermined phase is shifted by 180 degrees relative to a phase of the energy remaining in the tank circuit at the end of the modulation period.

8. The system of claim 5, wherein the control circuit supplies the second signal to the tank circuit at a peak of a sinusoidal waveform representing the energy remaining in the tank circuit.

9. The system of claim 5, wherein a point of application of the second signal to the tank circuit excludes a zero-crossing point of a sinusoidal waveform representing the energy remaining in the tank circuit.

10. The system of claim 1, wherein the control circuit reduces the energy remaining in the tank circuit by shortening the modulation period.

11. The system of claim 1, wherein the control circuit reduces the energy remaining in the tank circuit by extending an un-modulation period of the active load modulation.

12. A method comprising:
    receiving, at a tank circuit, a first signal transmitted from a near field communication reader;
    synchronizing a clock to the first signal;
    transmitting data utilizing the clock from the tank circuit to the near field communication reader utilizing active load modulation;
    disabling the synchronizing during a modulation period of the active load modulation; and
    reducing energy remaining in the tank circuit at an end of the modulation period.

13. The method of claim 12, further comprising reducing the energy remaining in the tank circuit between the end of the modulation period and a beginning of a subsequent un-modulation period of the active load modulation.

14. The method of claim 12, further comprising reducing the energy remaining in the tank circuit before enabling the synchronizing during a subsequent un-modulation period of the active load modulation.

15. The method of claim 12, further comprising reducing the energy remaining in the tank circuit by short-circuiting the tank circuit at the end of the modulation period.

16. The method of claim 12, further comprising reducing the energy remaining in the tank circuit by supplying a second signal with a predetermined phase to the tank circuit for a period of time at the end of the modulation period.

17. The method of claim 16, wherein the predetermined phase is different than a phase of the energy remaining in the tank circuit at the end of the modulation period.

18. The method of claim 16, wherein the predetermined phase is shifted by 180 degrees relative to a phase of the energy remaining in the tank circuit at the end of the modulation period.

19. The method of claim 16, further comprising supplying the second signal to the tank circuit at a peak of a sinusoidal waveform representing the energy remaining in the tank circuit.

20. The method of claim 16, wherein a point of application of the second signal to the tank circuit excludes a zero-crossing point of a sinusoidal waveform representing the energy remaining in the tank circuit.

21. The method of claim 12, further comprising reducing the energy remaining in the tank circuit by shortening the modulation period.

22. The method of claim 12, further comprising reducing the energy remaining in the tank circuit by extending an un-modulation period of the active load modulation.

* * * * *